(12) United States Patent
Arvet et al.

(10) Patent No.: US 9,543,409 B2
(45) Date of Patent: Jan. 10, 2017

(54) PRODUCTION OF SPACERS AT FLANKS OF A TRANSISTOR GATE

(71) Applicants: COMMISSARIAT A L'ENERGIE ATOMIQUE ET AUX ENERGIES ALTERNATIVES, Paris (FR); STMICROELECTRONICS SA, Montrouge (FR); STMICROELECTRONICS (CROLLES 2) SAS, Crolles (FR)

(72) Inventors: Christian Arvet, Bernin (FR); Sebastien Barnola, Villard Bonnot (FR); Sebastien Lagrasta, Montbonnot Saint Martin (FR); Nicolas Posseme, Grenoble (FR)

(73) Assignees: COMMISSARIAT A L'ENERGIE ATOMIQUE ET AUX ENERGIES ALTERNATIVES, Paris (FR); STMICROELECTRONICS SA, Montrouge (FR); STMICROELECTRONICS (Crolles 2) SAS, Crolles (FR)

( * ) Notice: Subject to any disclaimer, the term of this patent is extended or adjusted under 35 U.S.C. 154(b) by 0 days.

(21) Appl. No.: 14/855,834

(22) Filed: Sep. 16, 2015

(65) Prior Publication Data

US 2016/0079388 A1 Mar. 17, 2016

(30) Foreign Application Priority Data

Sep. 17, 2014 (FR) ...................................... 14 58759

(51) Int. Cl.
*H01L 29/66* (2006.01)
*H01L 21/283* (2006.01)
(Continued)

(52) U.S. Cl.
CPC ......... *H01L 29/6656* (2013.01); *H01L 21/283* (2013.01); *H01L 21/31111* (2013.01);
(Continued)

(58) Field of Classification Search
CPC ............. H01L 29/6656; H01L 29/6653; H01L 21/823468; H01L 21/823864; H01L 21/0223; H01L 21/02247; H01L 21/0234; H01L 21/02252
See application file for complete search history.

(56) References Cited

U.S. PATENT DOCUMENTS 6,232,641 B1 5/2001 Miyano et al.
6,635,938 B1 10/2003 Nakahata et al.
(Continued)

FOREIGN PATENT DOCUMENTS

KR 10-1025740 4/2011

OTHER PUBLICATIONS

U.S. Appl. No. 14/797,345, filed Jul. 13, 2015, Posseme.
(Continued)

*Primary Examiner* — Karen Kusumakar
(74) *Attorney, Agent, or Firm* — Oblon, McClelland, Maier & Neustadt, L.L.P.

(57) ABSTRACT

The production of spacers at flanks of a transistor gate, including a step of forming a dielectric layer covering the gate and a peripheral region of a layer of semiconductor material surrounding the gate, including forming a superficial layer covering the gate and the peripheral region; partially removing the superficial layer configured so as to completely remove the superficial layer at the peripheral region while preserving a residual part of the superficial layer at the flanks; and selective etching of the dielectric layer vis-à-vis the material of the residual part of the superficial layer and vis-à-vis the semiconductor material.

20 Claims, 4 Drawing Sheets

(51) Int. Cl.
H01L 21/311 (2006.01)
H01L 29/423 (2006.01)
H01L 29/51 (2006.01)

(52) U.S. Cl.
CPC .. *H01L 21/31116* (2013.01); *H01L 29/42364* (2013.01); *H01L 29/51* (2013.01); *H01L 29/517* (2013.01); *H01L 29/6653* (2013.01); *H01L 29/66628* (2013.01); *H01L 29/513* (2013.01)

(56) References Cited

U.S. PATENT DOCUMENTS

| | | | |
|---|---|---|---|
| 2002/0063299 A1 | 5/2002 | Kamata et al. | |
| 2004/0067612 A1 | 4/2004 | Guyader et al. | |
| 2004/0132258 A1 | 7/2004 | Jin et al. | |
| 2005/0064635 A1* | 3/2005 | Ajmera | H01L 21/02063 438/184 |
| 2005/0282344 A1 | 12/2005 | Jin et al. | |
| 2007/0166970 A1* | 7/2007 | Triyoso | H01L 21/28088 438/585 |
| 2008/0070328 A1* | 3/2008 | Omura | H01L 22/20 438/9 |
| 2013/0164940 A1* | 6/2013 | Raley | H01J 37/32192 438/696 |
| 2015/0162416 A1* | 6/2015 | Chang | H01L 29/6656 257/288 |

OTHER PUBLICATIONS

M. Vinet, et al., "Enabling the use of ion implantation for ultra-thin FDSOI n-MOSFETs" IEEE, XP32448888, 2012, 2 Pages.

French Preliminary Search Report and Written Opinion issued Apr. 17, 2015 in French Application 14 58759, filed on Sep. 17, 2014 (with English translation of categories of cited documents).

European Search Report dated Mar. 16, 2016, with partial English translation, issued in counterpart EP 15184982.5 (14 pages).

\* cited by examiner

PRODUCTION OF SPACERS AT FLANKS OF A TRANSISTOR GATE

TECHNICAL FIELD OF THE INVENTION

The present invention relates to transistors, particularly transistors of the MOS (Metal Oxide Semiconductor) type and more especially the production of the gate spacers of such transistors.

The invention relates to the microelectronics industry, which here includes nanotechnology, in the use of field effect transistors and in particular MOSFET transistors widely used in integrated circuits.

PRIOR ART

An example of a technology for producing source and drain regions of such transistors is given by the publication WO A1-0229881. This document also shows a case of manufacturing gate spacers.

FIG. 1 is a view in cross section of an example of this type of transistor in the course of production. The source and drain regions 120, 121 are found therein. The gate 100 conventionally consists of a stack of layers, a major part of which always consists of polycrystalline silicon 101. Source and drain regions 120, 121 are typically formed by ion implantation of dopants in the regions 120, 121, the gate 100 serving as a mask as mentioned above, thus preventing doping of the region of the transistor in which, depending on the voltages applied to the gate 100, the conduction channel 105 will be able to develop between source and drain.

The basic technique, very briefly described above, has constantly been improved for the purpose of improving the electrical performances of the transistors while making it possible to accommodate successive reductions in size of the transistors required by an ever increasing integration of a larger number of components in an integrated circuit.

One technique currently used consists of manufacturing the integrated circuits starting from elaborate substrates of the silicon on insulator type, referred by their acronym SOI (Silicon on Insulator). The elaborate substrate SOI is characterised by the presence of a fine superficial layer of monocrystalline silicon and germanium or silicon-germanium 112 resting on a continuous insulating layer of oxide 111, in particular of silicon, referred to as buried oxide or BOX (buried oxide layer). The layer 111 rests on the layer 110 that constitutes the body of the SOI substrate, often referred to by the term "bulk" in order to indicate that the starting substrate is generally made from solid silicon. This structure offers many advantages for producing MOSFET transistors. In particular, it affords a drastic reduction in stray capacitances because of the presence of the insulating continuous layer 111. The layers 103 and 104 constitute the gate oxide usually comprising, in recent designs, a layer 104 of a material with high relative permittivity, referred to as "high-k". The layer 102 is a hard mask serving to protect, at this stage of production, the stack of underlying gate layers. The superficial layer 112, for example made from monocrystalline silicon, can be controlled precisely for thickness and doping. In particular, it is advantageous for the performances of the transistors for the channel 105 to be able to be completely depleted of carriers, that is to say "fully depleted" (FD), the term that is generally used to designate this state. This is obtained by producing the transistors from SOI substrates with a very thin superficial layer 112. This type of transistor is thus designated by the acronym FDSOI.

One improvement to the basic auto-alignment technique that has been universally adopted consists of the formation of spacers 130 on the flanks of the gate 100. The spacers 130, typically made from silicon nitride (SiN), will make it possible in particular to use a so-called "raised source and drain" technique, an intermediate result of which is visible in FIG. 4. It has become normal for these operations to be carried out twice in succession in order to obtain the final result that is illustrated in FIG. 7, where two levels of spacers can be seen as well as two corresponding raised levels of the source and drain regions. In order to be able to maintain low electrical resistances of access to the source and drain electrodes, despite the reduction in size of the transistors, it has in fact been necessary to increase their cross section. This is achieved by selective epitaxy of the source/drain regions 120, 121. During this operation the initial surface layer 112 of monocrystalline silicon will be increased locally. It is then necessary to protect the gate regions in order to prevent the growth also taking place from the polycrystalline silicon 101 of the gate. Fulfilling this function is, among other things, the role of the spacers. They also fulfil a role of preserving the gate during the siliciding of the contacts (not shown), which is then performed for the same purpose in order to reduce the series resistance of access to the electrodes of the transistor.

The formation of the spacers 130 has become a crucial step in forming transistors, which now reach dimensions that are normally measured in nanometers (nm=$10^{-9}$ meters) and are roughly of decananometric sizes. The spacers 130 are produced in this technology without involving any photoetching operation.

In order to achieve this, FIG. 2 shows the formation of first layer of nitride 131, in particular silicon nitride (SiN). This layer is next subjected, at the step in FIG. 3, to a highly anisotropic etching so that the etching eliminates the parts of the layer 131 situated on the surface layer 112 (which are generally horizontal, that is to say oriented perpendicular to the thickness of the substrate 110) while at least partly preserving the nitride on the non-horizontal parts and particularly on the parts forming the flanks 106, 107 of the of the gate 100.

In this way a first level of spacers is obtained, formed by the residual parts made from nitride covering the flanks 106, 107.

After wet cleaning, a first step of growth of the sources and drains is carried out, as in FIG. 4, by epitaxy at the regions 120, 121.

Second-level spacers are then produced. To this end, a new layer of nitride 132 is deposited, as shown by FIG. 5.

In a similar way to the case in FIG. 3, FIG. 6 illustrates an etching of the layer of nitride 132 such that the layer 132 is, at least partly, preserved only on the flanks of the gate, forming second-level spacers 135 covering the spacers 130 already formed at this level. Overall, these steps lead to spacers 135, the feet of which each has a recess 133.

A new epitaxy phase is then produced so that the source/drain regions 120, 121 intersect around the gate 100, the latter being protected by the spacers 130 as presented in FIG. 7.

The technology thus described proves to be complex, especially through the number of steps used. In general, even for producing spacers on the same level, the current techniques do not make it possible to precisely control the etching phases and therefore the final form of the parts constituting the transistor, in particular the form of the base of the spacers.

The document US A1-2004/0132258 discloses the formation, at the transistor gate flanks, of two layers of spacers. The two layers are then etched simultaneously above the substrate in order to keep in place only the vertical parts.

The document U.S. Pat. No. 6,635,938 also provides for two layers of spacers, the horizontal parts of which are removed simultaneously, in order to keep in place only the vertical part around the gate flanks.

The present invention makes it possible to respond to at least some of the drawbacks of the current techniques.

SUMMARY OF THE INVENTION

One aspect of the invention relates to a method for producing spacers at flanks of a transistor gate in which the gate is situated above a layer of semiconductor material. Advantageously the method successively comprises the following steps:

formation of a dielectric layer that covers the gate and at least a peripheral region of the layer of semiconductor material surrounding the gate;

formation of a superficial layer covering the dielectric layer;

partial etching of the superficial layer configured so as to completely remove the superficial layer at the peripheral region while preserving a residual part of the superficial layer at the flanks; this etching at least partly preserves the dielectric layer at the peripheral region;

then, after the partial etching, etching of the dielectric layer selectively with respect to the residual part of the superficial layer and with respect to the layer of semiconductor material.

Thus, during the etching phase for removing the material of the dielectric layer above the regions around the gate (that is to say at the source/drain regions), the part of this layer that is level with the gate flanks is protected by the superficial layer that remains at this point. It is therefore possible to more freely adjust the parameters of the final etching, which is a selective etching relative to the superficial layer, so as for example to control the form to be given to the feet of the spacers, or to prevent an attack on the material of the surface layer, for example made from nanocrystalline silicon (but also possibly germanium or silicon-germanium).

Contrary to the prior art known from US A1-2004/0132258 and U.S. Pat. No. 6,635,938, the invention combats a same prejudice that consists of carrying out the simultaneous removal of the superficial layer and the dielectric layer through simplicity in terms of manufacturing process. The etching takes place on the contrary on two occasions through the invention, with partial etching and, after its completion, an etching of the dielectric layer. In principle less optimum, this way of proceeding on the contrary makes it possible to produce etchings that are highly selective in relation to the environment of the layers to be removed. In particular, the dielectric layer is removed, by virtue of the invention, without damaging the layer of underlying semiconductor material. This result is impossible with the existing techniques. The invention is thus compatible with technologies in which the thickness of the semiconductor layer is small, for example less than 5 nm, and the method can be applied to substrates of silicon on insulator (SOI) type, including FDSOI (standing for Fully Depleted Silicon on Insulator).

According to one embodiment, the formation of the superficial layer comprises a modification to the material on only part of the thickness of the dielectric layer. It is therefore not necessarily required to proceed with a deposition step for producing the superficial layer. It is possible in particular to proceed with an oxidation of the material of the dielectric layer, in particular if it is based on or made from nitride, such as silicon nitride. In this regard, it should be noted that the oxidation can be carried out by plasma under isotropic or quasi-isotropic conditions so that the oxidised layer is conforming. At the same time, optionally in the same reactor, it is possible to proceed with a less isotropic etching (and in practise highly anisotropic) etching so as to completely remove the oxidised layer only at the required places (that is to say outside the flank regions of the gate).

According to certain aspects of embodiments of the invention, all the steps or at least some successive steps can be carried out in the same reactor. Use of plasma technology therefore makes it possible to avoid handling.

It should moreover be noted that it is possible to obtain, when required, spacers the foot of which comprises a recess, without having recourse to two series of phases of deposition and etching of the layers of the nitride as in the prior art.

The invention also relates, in some embodiments, to a transistor with a raised source/drain structure in which a gate and source and drain regions are situated above a layer of semiconductor material and which comprises spacers at the flanks of the gate configured so as to isolate the gate from the source and drain regions. This transistor is preferentially such that the spacers have a single layer of a dielectric material, preferably silicon nitride. In addition or alternatively, the transistor may comprise parts at least partially covering the single layer of the spacers, preferably made from an oxide of the dielectric material of the single layer.

According to a non-limitative complementary or alternative possibility, the source and drain regions are situated in a single layer of a material, said single layer being situated above the layer of a semiconductor material.

According to another non-limitative possibility, the spacers comprise a foot region above layer of semiconductor material, the foot region comprising a recess in the direction of the flank of the gate so as to form an indentation.

Another aspect of the invention is a transistor, such as an MOS transistor, in which the gate spacers are partially covered with a superficial layer of a material different from the material of the spacers, for example an oxide of the material of the spacers. Such a transistor can be obtained by the method of the invention.

Another aspect of the invention concerns a method for producing a transistor in which the gate is situated above a layer of a semiconductor material, said method comprising the production of spacers in accordance with the method for producing spacers of the invention. It may comprise the production of source and drain regions with a growth by epitaxy on the layer of semiconductor material.

BRIEF DESCRIPTION OF THE FIGURES

The aims, objects, features and advantages of the invention will emerge more clearly from a detailed description of an embodiment thereof that is illustrated by the following accompanying drawings, in which.

DETAILED DESCRIPTION OF THE INVENTION

Figure 1:
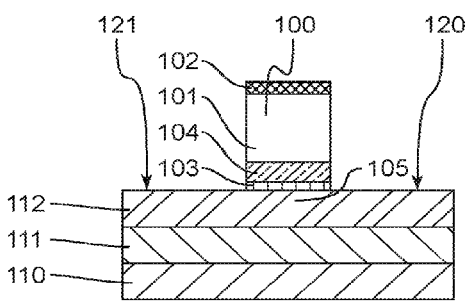
FIGS. 1 to 7 illustrate successive phases of producing spacers on two levels and source/drain around a transistor gate, according to the prior art, the spacers with two levels having a form such that their foot has a recess towards the gate.
Figure 2:
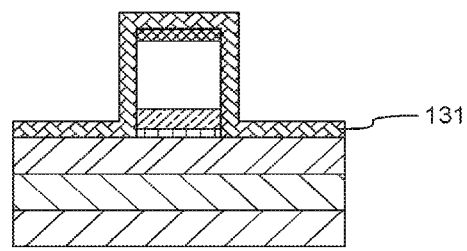
Figure 3:
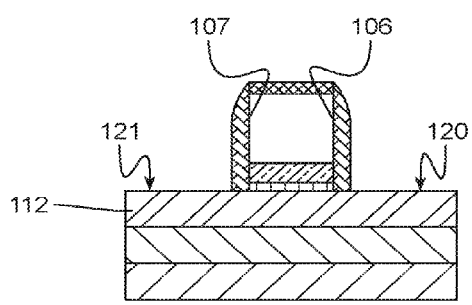
Figure 4:
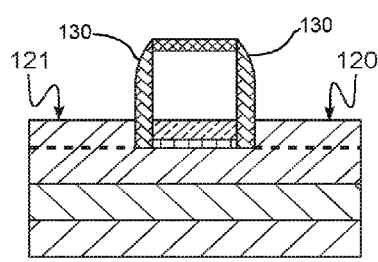
Figure 5:
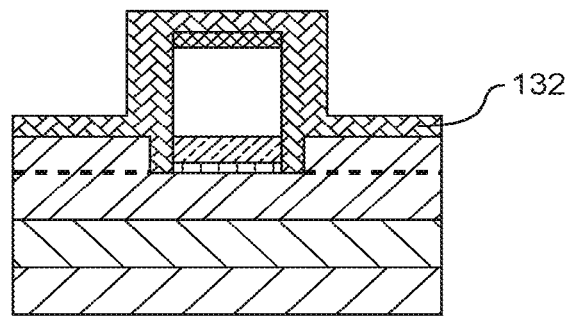
Figure 6:
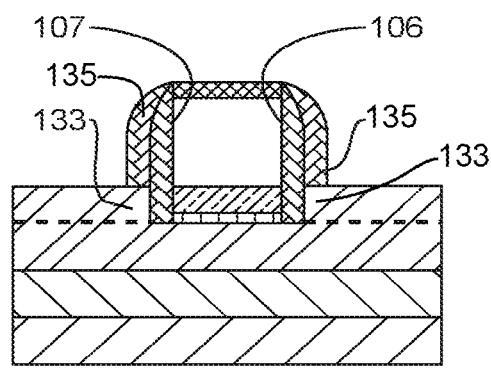

Before going into the detail of the embodiment of the invention, in particular with reference to the drawings, non-limitative features that the invention may have individually or according to all combinations are briefly introduced below:

the formation of the superficial layer comprises a modification to the material of only part of the thickness of the dielectric layer;

the modification is an oxidation;

the oxidation is carried out conformingly at the flanks and the peripheral region;

the oxidation is carried out using a plasma;

an oxygen plasma is used in which the energy of the ions is between 8 and 13 eV, preferable 10 eV;

the formation of the superficial layer comprises a deposition of a layer of material above the dielectric layer;

the material of the layer of material above the dielectric layer is chosen from a material comprising carbon, an oxide such as silicon dioxide ($SiO_2$), a material containing germanium and in particular silicon-germanium or a silicon-germanium nitride, preferably a proportion of germanium from 15% to 40%;

the partial removal of this superficial layer is an etching carried out using a plasma;

the etching of the partial removal of the superficial layer is an anisotropic action configured so as to attack the superficial layer at the peripheral region while not attacking the superficial layer at the gate or attacking it less;

the anisotropic etching is carried out with an argon or carbon tetrafluoride plasma in which the energy of the ions is between 8 and 13 eV, preferably 10 eV;

the selective etching is carried out using a plasma;

the anisotropic etching and then the selective etching are carried out in the same reactor;

the selective etching is carried out by wet method the selective etching is configured so as to partially attack the dielectric layer in a gate foot region situated below the residual part in the direction of the flank of the gate so as to form a recess;

the recess has a height of between 5 and 30 nm, preferably between 10 and 15 nm;

the recess has a width of between 5 and 10 nm and/or a width less than the height of the recess;

the selective etching is configured so as to form a straight edge in the dielectric layer along the thickness of the dielectric layer in alignment with the residual part;

the dielectric layer is made by a layer of nitride, preferably a silicon nitride;

the dielectric layer is made from a low-k material with a dielectric constant lower than that of silicon nitride;

a superficial layer of a fully depleted silicon on insulator (FD-SOI) wafer is used as a semiconductor layer.

In the context of the present invention, the terms "on", "surmounts" or "underlying" or their equivalents do not necessarily mean "in contact with". Thus, for example, the deposition of a first layer on a second layer does not necessarily mean that the two layers are directly in contact with each other but means that the first layer at least partially covers the second layer while being either directly in contact therewith or being separated from it by another layer or another element.

In the following description, the thicknesses are generally measured in directions perpendicular to the plane of the bottom face of the layer to be etched or of a substrate on which the bottom layer is disposed. Thus the thicknesses are generally taken in a vertical direction on the figures depicted. On the other hand, the thickness of a layer covering a flank of a pattern is taken in a direction perpendicular to this flank.

Hereinafter, selective etching means the removal by etching of a given material while at least partially preserving, through the selectivity of the method used, other materials.

The words "superficial layer" means a layer that is formed, in particular, by modifying the underlying layer or by a deposition of this underlying layer on the surface of the electronic device after the formation of the underlying layer. It is next partially removed in order to partly remove the underlying layer. The adjective "superficial" does not necessarily signify that the residual superficial layer always remains on the surface of the device when the manufacture of the latter is finalised. It may for example be removed or covered.

"Conforming" means a layer geometry that has the same thickness, to within the manufacturing tolerances, an identical thickness despite the changes in direction of the layer, for example despite the changes in direction of the layer, for example at the gate pattern flanks.

The word "dielectric" means material the electrical conductivity of which is sufficiently low in the given application to serve as an insulator.

The method for producing spacers according to the invention is illustrated by FIGS. 9 to 14. The method applies after the gates of the transistors have been formed, that is to say from a structure such as that illustrated by FIG. 8, which is not different, in this example, from that of FIG. 1 already described. The method of the invention can in fact potentially be implemented from any MOSFET transistor structure after the gate patterns have been defined by photolithography.

Figure 8:
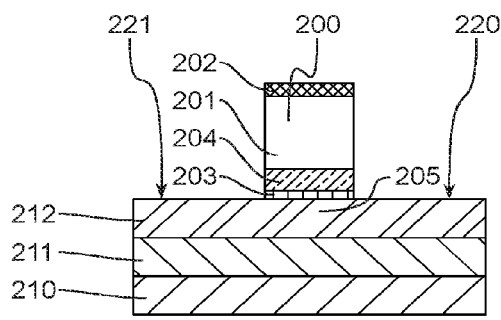
FIG. 8 presents a possible gate and substrate configuration at the start of the method of the invention.

In FIG. 8, used as a typical example of a starting point for an application of the method of the invention, the elements already described are therefore found:

The source and drain regions 220 and 221, which are overall designated as source/drain regions since they are very generally perfectly symmetrical and can fulfil one or other role according to the electrical biasings that are applied to the transistor.

The gate 200 conventionally consists of a stack of layers, a major part of which always consists of polycrystalline silicon 201. The layers 203 and 204 constitute the gate oxide usually comprising in recent designs a layer 204 of a material with a high relative permittivity referred to as "high-k". The layer 202 is a hard mask used to protect, at this stage of implementation, the stack of underlying gate layers.

A conduction channel 205 between source and drain will be able to form if an appropriate voltage is applied to the gate 100 developing a sufficient electrical field through the dielectric layers 203 and 204.

As seen, a technique commonly used at present consists of manufacturing the integrated circuit starting from elaborate substrates of the SOI type. In the structure in FIG. 8 the layers constituting this type of substrate are found. That is to say: a thin superficial layer of monocrystalline silicon, germanium or silicon-germanium 212 resting on a continuous insulating layer of oxide, referred to as BOX, 211. The layer 210 constitutes the body of the SOI substrate.

Figure 9:
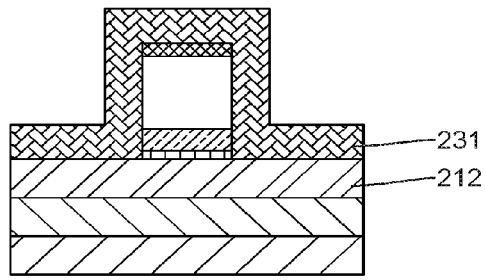
FIGS. 9 to 14 show steps of the invention.

FIG. 9 illustrates the first step of the method according to the invention during which the spacers will be produced in a single series of steps, unlike the traditional method, briefly described in the part on the prior art, which requires implementing two successive series of steps each comprising: the deposition of the material constituting the spacers, etching thereof and an epitaxial growth of the source/drain regions.

As shown in FIG. 9, for producing the spacers in a single step, a single deposition of a layer 231 of a material such as silicon nitride (SiN) is carried out over a thickness corresponding to the total thickness of the two spacers obtained with the standard method. Typically, a so-called "conforming" deposition is carried out over a thickness for example ranging from 20 to 30 nm, preferably 25 nm. The deposition is conforming if it is done equally whatever the orientation of the surfaces on which it is carried out. To obtain this result the deposition is preferably carried out by means of a so-called PECVD method, the acronym for "plasma-enhanced chemical vapour deposition", or a so-called LPCVD method, the acronym for "low-pressure chemical vapour deposition". At the end of this step, as shown in FIG. 9, the deposited layer 231 has a thickness substantially equal on the flanks of the gate patterns and on the horizontal parts, that is to say those parallel to the plane of the substrate.

Figure 10:
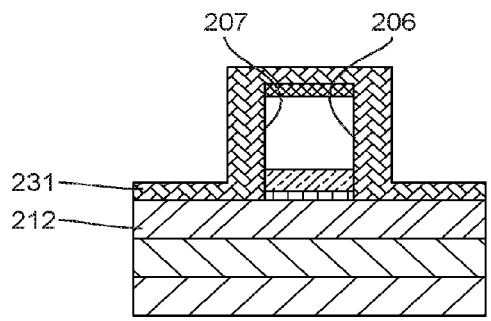

As shown in FIG. 10, an anisotropic etching of the layer 231 is next carried out, that is to say an essentially vertical etching of the deposited material, an etching that is therefore done perpendicular to the plane of the substrate and which does not, or only very slightly, etch the flanks of the gate patterns 206 and 207. This type of etching is advantageously carried out using a plasma in an etching reactor of the capacitive coupling (CCP) or inductive coupling (ICP) type and preferably in a reactor of the latter type. This anisotropic etching is intended to reduce the thickness of the layer 231 in the peripheral regions surrounding the gate 200 to a value corresponding to the thickness (for example between 10 and 15 nm) of the first deposit of material constituting the spacers of the conventional method during which these are formed in two series of steps as seen above. The conditions of such an anisotropic etching are for example those for an inductive coupling reactor: pressure=5 millitorr; power of the source=300 watts; biasing voltage=65 volts; flow rate of trifluoromethane ($CHF_3$)=30 sccm (standard cubic centimeters per minute); flow rate of helium (He)=220 sccm; temperature of the substrate carrier (for example electrostatic)=110° C. Under these conditions the speed of etching of the silicon nitride, the standard material used for forming the spacers, is then around 32 nm per minute.

Figure 11:
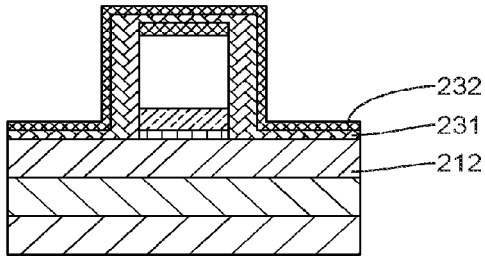

FIG. 11 illustrates the result of the following step, during which a surface oxidation 232 of the layer 231 of the material intended to form the spacers is carried out. This operation is advantageously performed isotropically using a plasma, for example under the following conditions: pressure=10 millitorr; power of the source=1000 watts; flow rate of oxygen ($O_2$)=200 sccm; temperature of the substrate carrier=60° C. This oxidation is preferably produced in the same reactor as that of the anisotropic etching. Alternatively the layer 232 of oxide or of another material (such as silicon-germanium nitride or another material with germanium, preferably with a proportion of germanium of 15% to 40%, or a carbonaceous material or $SiO_2$ or another oxide) can be obtained by deposition. The thickness thus produced may be between 2 and 10 nm, preferably 7 nm.

Figure 12:
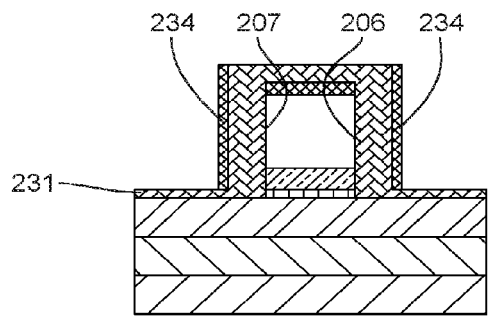

FIG. 12 shows the result of the following step, at the end of which the oxidised layer 232 is left in place only on the flanks of the gate patterns. This result is obtained by means of a highly anisotropic vertical etching operation referred to as "breakthrough", which is performed for example in an argon (Ar) or carbon tetrafluoride ($CF_4$) plasma and which etches essentially all the oxidised surfaces parallel to the plane of the substrate, at least partly leaving in place the oxidised surfaces not parallel to the substrate at the flanks 205, 206.

Figure 7:
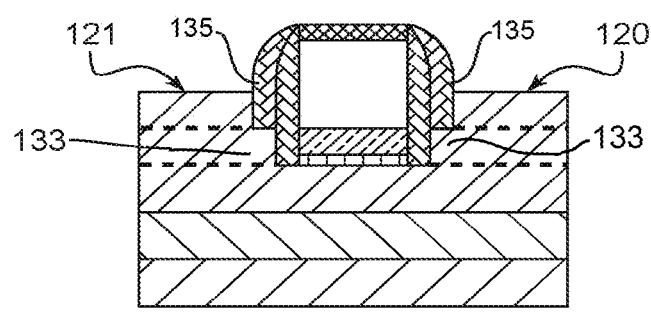
Figure 13:
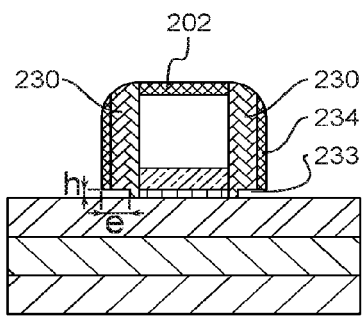

FIG. 13 shows the result of the step of lateral etching of the parts of the material forming the spacers that were deoxidised at the previous step. This etching is selective vis-à-vis the underlying semiconductor layer 212 and also vis-à-vis the remaining oxidised layer 234, which are therefore not significantly etched during this operation. This step provides removal of the layer 231 above the layer 212, outside the space occupied by the gate and the spacers. Typically it is the portion of the layer 231 oriented parallel to the face of the substrate, horizontally in the case of the figures, that is to say again the peripheral region explained previously. This step follows the etching of the layer 232 and is not simultaneous, so as to provide a different selectivity of the two etchings. This step of etching the part of the layer 231 outside the spacers may be accompanied, advantageously simultaneously, by an etching of this material at the spacers (in particular in line with the residual part 234 of the superficial layer 232. Thus, optionally, it is therefore possible to obtain a lateral etching at the foot of the spacers that reproduces the forms obtained with the standard method as shown in FIG. 7. More generally, it is therefore possible to adjust a more or less marked recess 233 according to the etching conditions used or not to have a recess at all. The etching is here said to be lateral in that it produces an attack essentially parallel to the substrate because of its selectivity. This etching is in fact preferably isotropic. Because of this, the geometry of the recess, in particular of the flank of the recess along the height h in FIG. 13, may be non-rectilinear. In practice, it may be in an arc of a circle.

The lateral etching may be done using a plasma formed under the following conditions: pressure=50 to 80 millitorr; power of the source=400 watts; biasing voltage=250 volts; flow rate of fluoromethane ($CH_3F$)=200 sccm; flow rate of oxygen ($O_2$)=200 sccm; flow rate of helium (He)=120 sccm; flow rate of silicon tetrachloride ($SiCl_4$)=5 sccm; temperature of the substrate carrier=60° C. The biasing voltage is preferentially pulsed at a frequency of 500 Hz with a duty factor of 50%. Other pulsation conditions may be used: 200 Hz/20%; 900 Hz/90%; 200 Hz/90%. The same reactor as before can be used.

The lateral etching may also be done by wet method in a solution based on phosphoric acid ($H_3PO_4$). In this case the rate of attack of the silicon nitride, a material that is generally used for the spacers, is 4 nm per minute. The temperature is for example between 80° C. and 120° C. and preferably 100° C. This chemistry has infinite selectivity with respect to the oxide present on the residual parts 234 present on the flanks of the spacers. It is also chosen so as to be selective with respect to the material of the layer 212.

Figure 14:
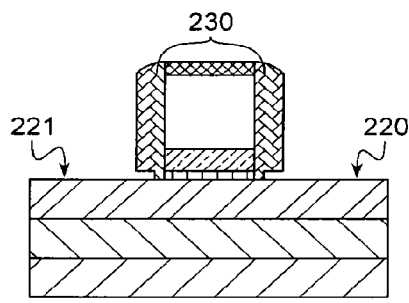

FIG. 14 shows a form of the spacers 230 that can be obtained in practice with the method of the invention, the residual parts 234 having been removed, which is not obligatory but can be done, in particular during a cleaning step, especially if the material of the parts 234 is an oxide sensitive to the cleaning solution.

This is because, conventionally, prior to the epitaxy operation, a wet cleaning of the surface of the layer 212 from which the epitaxy or growth is to take place is preferably carried out. The cleaning is preferentially done by means of a solution based on hydrofluoric acid (HF), for example diluted to 0.5%, for 30 seconds. The purpose of this cleaning is to remove the polymers and the layer of native oxide on the surface of the semiconductor, which is silicon (Si) or a compound of silicon and germanium (SiGe). In another embodiment, the parts 234 are kept in place.

Figure 15:
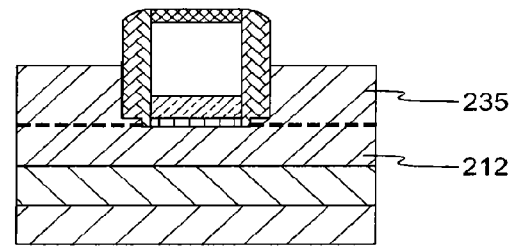
FIG. 15 illustrates the single epitaxy step of the method of the invention during which raised source and drain regions are produced.

FIG. 15 illustrates the step of selective epitaxial growth 235 of the source and drain regions that is next carried out. As has been seen, this operation is performed only once with the method of the invention whereas it must be repeated a second time when the standard method of forming spacers is used.

An epitaxial layer 235 is grown with a thickness for example equivalent to that which is obtained with the standard method at the end of the second series of steps of forming the spacers. For forming the source and drain regions an in situ doping of these regions can be carried out, that is to say in the epitaxial reactor itself, by introducing therein in gaseous form the doping species necessary such as boron (p-type doping) or arsenic (n-type doping). Optionally, if in situ doping is not used, an implantation of the doping species can be carried out in an implanter after formation of the epitaxial layer.

In a variant embodiment of the invention, the material constituting the spacers can advantageously be a material with a lower relative permittivity (low-k) than the silicon nitride that is traditionally used, in order to reduce the stray capacitances of the transistor (between drain/source on the one hand and the gate on the other hand).

Figure 16A:
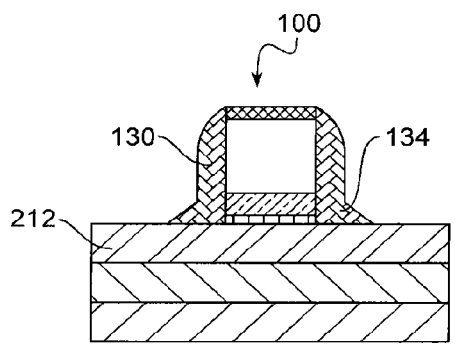
FIG. 16A presents an undesired case of a form of spacer foot that is found after etching the layer of silicon nitride according to existing techniques.
Figure 16B:
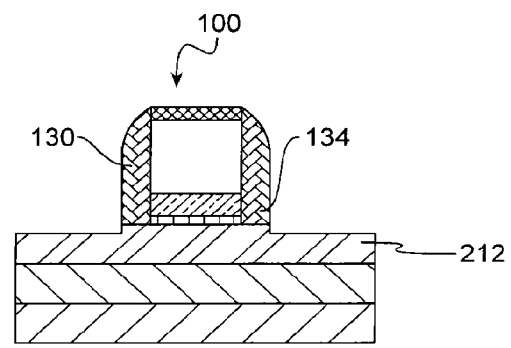
FIG. 16B shows another undesired case where the layer serving for the epitaxial growth of the source and drain is attacked.

FIG. 16A illustrates a problem that frequently occurs with the standard method of producing the spacers, where it is difficult to control the etching of the first spacer without damaging the fine superficial semiconductor layer 212 of the substrate (such damage is illustrated in FIG. 16B. In wishing to avoid damaging this layer, "feet" 134 are often undesirably formed at the bottom of the first spacers.

Another problem mentioned above with the standard method for forming the spacers where, when there is an excessively strong etching of the first spacers, the fine layer 212 of semiconductor is damaged, as in FIG. 16B, which then no longer makes it possible to carry out defect-free epitaxy of the source and drain regions. Thus the standard method involves either faulty geometry of the foot of the spacer or damage to the layer of the semiconductor material serving as a basis for the epitaxy.

Figure 17:
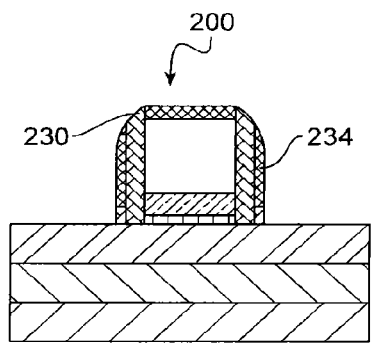
FIG. 17 illustrates the absence of the defects mentioned in the previous two figures when the method of the invention is used The accompanying drawings are given by way of examples and are not limitative of the invention. These drawings are schematic representations and are not necessarily to the scale of the practical application. In particular, the relative thicknesses of the layers and substrates do not represent reality.

The method of the invention dispenses with these problems. As shown in FIG. 17, there is no longer any formation of feet since it is possible to adjust the parameters of the etching plasma, in particular the etching time, without damaging the layer of semiconductor 212, the layer from which it will be possible to proceed with an epitaxy of the source and drain regions without any defect.

The invention claimed is:

1. A method for producing spacers at flanks of a transistor gate, the gate being situated above a layer of a semiconductor material, the method comprising successively the following steps:
    forming a dielectric layer that covers the gate and at least a peripheral region of the layer of semiconductor material surrounding the gate;
    anisotropic etching of the dielectric layer, thereby reducing a thickness of the dielectric layer at a region covering an upper surface of the gate and at the peripheral region, while substantially preserving a thickness of the dielectric layer at the flanks;
    forming a superficial layer covering the dielectric layer;
    partial etching of the superficial layer configured so as to completely remove the superficial layer at the peripheral region while preserving a residual part of the superficial layer at the flanks, and while at least partly preserving the dielectric layer at the peripheral region; and
    then, after the partial etching, selectively etching the dielectric layer with respect to the residual part of the superficial layer and with respect to the layer of semiconductor material.

2. The method according to claim 1, wherein the formation of the superficial layer comprises a modification to a material of only part of the thickness of the dielectric layer.

3. The method according to claim 2, wherein the modification is an oxidation.

4. The method according to claim 3, wherein the oxidation is carried out conformingly at the flanks and the peripheral region.

5. The method according to claim 3, wherein the oxidation is carried out using a plasma.

6. The method according to claim 5, wherein an oxygen plasma is used in which an energy of ions in the plasma is between 8 eV and 13 eV.

7. The method according to claim 1, wherein the formation of the superficial layer comprises a deposition of a layer of material above the dielectric layer.

8. The method according to claim 7, wherein a material of the layer of material above the dielectric layer is chosen from: a material comprising carbon, silicon dioxide ($SiO_2$), and a material containing germanium.

9. The method according to claim 1, wherein the partial etching of the superficial layer is an etching carried out using a plasma, and wherein the partial etching of the superficial layer is another anisotropic etching configured so as to attack the superficial layer at the peripheral region while substantially not attacking the superficial layer at the gate.

10. The method according to claim 9, wherein the another anisotropic etching is carried out with an argon or carbon tetrafluoride plasma in which an energy of ions in the plasma is between 8 eV and 13 eV.

11. The method according to claim 9, wherein the selective etching of the dielectric layer is carried out using a plasma.

12. The method according to claim 11, wherein the another anisotropic etching and then the selective etching of the dielectric layer are carried out in the same reactor.

13. The method according to claim 1, wherein the selective etching of the dielectric layer is carried out by wet method.

14. The method according to claim 1, wherein the selective etching of the dielectric layer is configured so as to partially attack the dielectric layer in a gate foot region situated below the residual part in a direction of the flanks of the gate, so as to form a recess.

15. The method according to claim 14, wherein the recess has a height of between 5 nm and 30 nm.

16. The method according to claim 14, wherein the recess has a width of between 5 nm and 10 nm and/or a width less than a height of the recess.

17. The method according to claim 1, wherein the selective etching of the dielectric layer is configured so as to form a straight edge in the dielectric layer across the thickness of said dielectric layer in alignment with the residual part.

18. The method according to claim 1, wherein a superficial layer of a fully depleted silicon on insulator (FD-SOI) wafer is used as the layer of a semiconductor material.

19. A method for producing a transistor having a gate situated above a layer of semiconductor material, said method comprising the production of spacers according to claim 1.

20. The method according to claim 19, further comprising production of source and drain regions with a growth by epitaxy on the layer of semiconductor material.

* * * * *